（12）United States Patent
Tanamura et al.

(10) Patent No.: US 11,804,272 B2
(45) Date of Patent: Oct. 31, 2023

(54) MEMORY SYSTEM AND STORAGE SYSTEM

(71) Applicant: KIOXIA CORPORATION, Tokyo (JP)

(72) Inventors: Yugo Tanamura, Yokohama Kanagawa (JP); Kengo Kumagai, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 136 days.

(21) Appl. No.: 17/408,776

(22) Filed: Aug. 23, 2021

(65) Prior Publication Data

US 2022/0336024 A1 Oct. 20, 2022

(30) Foreign Application Priority Data

Apr. 20, 2021 (JP) .................. 2021-070912

(51) Int. Cl.
| G11C 16/16 | (2006.01) |
| G11C 16/34 | (2006.01) |
| G11C 16/30 | (2006.01) |
| G11C 17/16 | (2006.01) |
| G11C 16/26 | (2006.01) |
| G11C 5/14 | (2006.01) |
| G11C 16/10 | (2006.01) |

(52) U.S. Cl.
CPC ............ G11C 16/3404 (2013.01); G11C 5/14 (2013.01); G11C 16/102 (2013.01); G11C 16/26 (2013.01); G11C 16/30 (2013.01); G11C 17/16 (2013.01)

(58) Field of Classification Search
CPC ..... G11C 16/3404; G11C 5/14; G11C 16/102; G11C 16/26; G11C 16/30; G11C 17/16; G11C 11/4074; G11C 5/143; G06F 1/26; G06F 1/28; G06F 1/30; Y02D 10/00
See application file for complete search history.

(56) References Cited

U.S. PATENT DOCUMENTS

| 10,401,935 B2 | 9/2019 | Brennan et al. |
| 2018/0018245 A1 | 1/2018 | Kori et al. |
| 2020/0081630 A1 | 3/2020 | Sorenson et al. |
| 2021/0055776 A1* | 2/2021 | Parry .................. G06F 1/3275 |

FOREIGN PATENT DOCUMENTS

JP 2018-010557 A 1/2018

* cited by examiner

*Primary Examiner* — Xiaochun L Chen
(74) *Attorney, Agent, or Firm* — Kim & Stewart LLP

(57) ABSTRACT

A memory system includes a nonvolatile memory, a controller configured to control the nonvolatile memory, a power supply circuit that is connected to the controller and configured to generate a power supply voltage for the nonvolatile memory and the controller from a voltage supplied from at least one external power supply, and a power storage device that is connected to the power supply circuit and configured to charge to a first energy from a charging voltage supplied by the power supply circuit, and an energy sharing pin that is connected to the power supply circuit and the power storage device, and is connectable to an external power storage device in an external memory system.

20 Claims, 7 Drawing Sheets

MEMORY SYSTEM AND STORAGE SYSTEM

CROSS-REFERENCE TO RELATED APPLICATION

This application is based upon and claims the benefit of priority from Japanese Patent Application No. 2021-070912, filed Apr. 20, 2021, the entire contents of which are incorporated herein by reference.

FIELD

Embodiments described herein relate generally to a memory system and storage system.

BACKGROUND

A memory system including a nonvolatile memory is widely used. One example of such a memory system is a solid state drive (SSD) including a flash memory.

A certain type of SSD has a power loss protection (PLP) function so that data in the middle of being written from a volatile memory to a nonvolatile memory is not lost when an external power supply is unintentionally cut off. In order to perform the PLP function, it is required to provide a backup power supply inside the SSD. As a backup power source, for example, a power storage device including at least one capacitor is used. The SSD uses the energy of the power storage device to complete the writing of data to the nonvolatile memory and prevents the loss of data during writing.

DETAILED DESCRIPTION

Embodiments provide a power storage device of a memory system equipped with a semiconductor storage device, in which reduction of mounting area is achieved.

In general, according to one embodiment, there is provided a memory system including a nonvolatile memory, a controller configured to control the nonvolatile memory, a power supply circuit that is connected to the controller and configured to generate a power supply voltage for the nonvolatile memory and the controller from a voltage supplied from at least one external power supply, a power storage device that is connected to the power supply circuit and is configured to charge to a first energy from a charging voltage supplied by the power supply circuit, and an energy sharing pin that is connected to the power supply circuit and the power storage device, and is connectable to an external power storage device in an external memory system.

Hereinafter, embodiments of the present disclosure are described. In addition, in the following description, the "connection" means not only a case where two components are directly connected but also a case where two components are connected via another element.

First Embodiment (Configuration)

Configurations of the memory system according to a first embodiment are described with reference to FIGS. 1 to 5.

Figure 1:
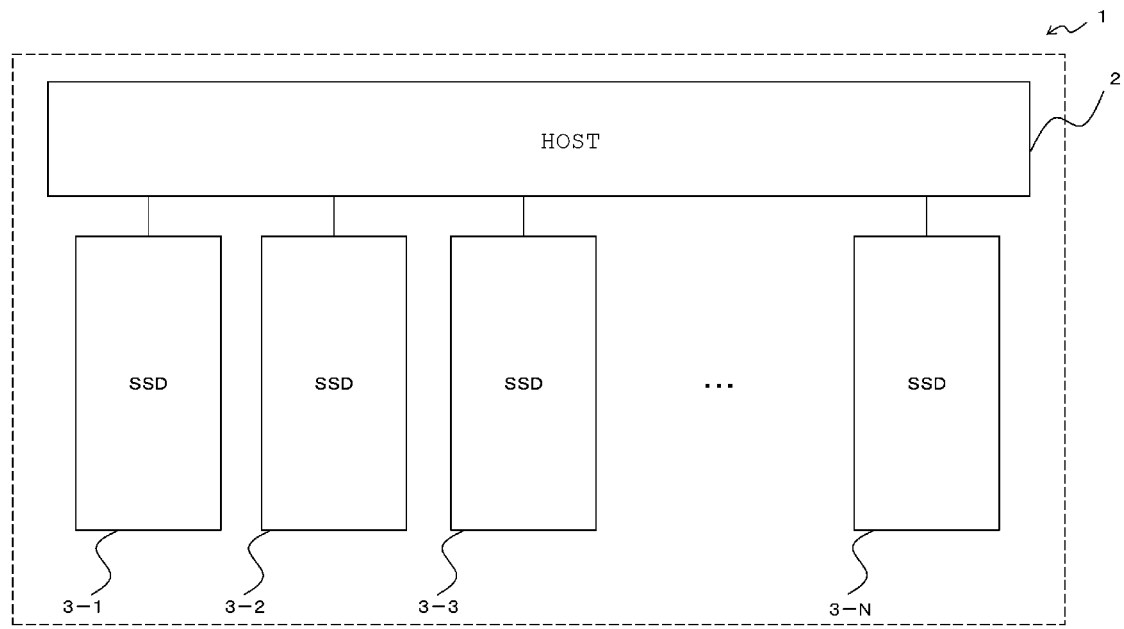
FIG. 1 is a block diagram illustrating an example of a configuration of an information processing system including a memory system according to a first embodiment.

FIG. 1 is a block diagram illustrating an example of a configuration of the information processing system including the memory system according to the first embodiment. According to the present embodiment, an SSD is used as an example of a memory system. As illustrated in FIG. 1, an information processing system 1 includes a host device (hereinafter, simply referred to as a host) 2 and a plurality of SSD's 3 (an SSD 3-1, an SSD 3-2, an SSD 3-3, . . . , and an SSD 3-N).

The host 2 is an information processing device that accesses the SSD's 3 as an external device. The host 2 may be a server (e.g., storage server) that stores a large amount of various kinds of data in the SSD's 3 or may be a personal computer.

The SSD's 3 may be used as a main storage of an information processing device that functions as the host 2. The plurality of SSD's 3 may be included in a storage system. In the present embodiment, the SSD's 3 are provided outside this information processing device and are connected to this information processing device via cables. Alternatively, the SSD's 3 may be connected to the information processing device via a network. In addition, the SSD's 3 may be built in this information processing device.

Figure 2:
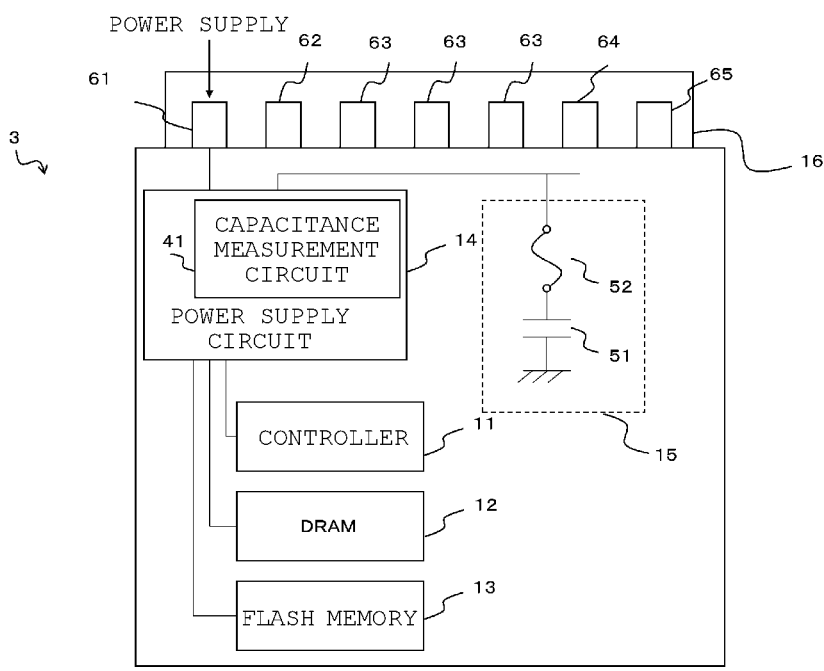
FIG. 2 a block diagram illustrating an example of a configuration of the memory system according to the first embodiment.

FIG. 2 is a block diagram illustrating an example of a configuration of the memory system according to the first embodiment. The memory system according to the present embodiment is a semiconductor storage device that is configured so that data is written to a nonvolatile memory, and data is read from a nonvolatile memory. Examples of the nonvolatile memory include a NAND-type flash memory, a NOR-type flash memory, a Magneto-resistive Random Access Memory (MRAM), a Phase change Random Access Memory (PRAM), a Resistive Random Access Memory (ReRAM), and a Ferroelectric Random Access Memory (FeRAM). According to the present embodiment, a NAND-type flash memory (hereinafter, simply referred to as a flash memory) is used as an example of the nonvolatile memory.

As illustrated in FIG. 2, the SSD 3 includes a controller 11, a Dynamic Random Access Memory (DRAM) 12, a flash memory 13, a power supply circuit 14, a PLP capacitor 15, a connector 16, and the like.

The controller 11 functions as a memory controller configured to control the flash memory 13. The controller 11 may be implemented by a circuit such as a System on a Chip (SoC). The controller 11 writes data to the flash memory 13 or read data from the flash memory 13 according to the command from the host 2.

The DRAM 12 is an example of the volatile memory. The DRAM 12 is, for example, a DRAM of the Double Data Rate 3 Low voltage (DDR3L) standard. The DRAM 12 may be provided with a write buffer and a read buffer. The write buffer is a buffer area that temporarily stores data to be written to the flash memory 13. The read buffer is a buffer area that temporarily stores data read from the flash memory 13.

The DRAM 12 may be provided outside the controller 11 and may be provided inside the controller 11. In addition, as the volatile memory, a Static Random Access Memory (SRAM) that can perform the high-speed access instead of the DRAM 12 may be used.

The flash memory 13 may include a plurality of flash memory chips. The flash memory 13 includes a memory cell array including a plurality of memory cells arranged in a matrix configuration. The flash memory 13 may have a two-dimensional structure or a three-dimensional structure.

The memory cell array in the flash memory 13 includes a plurality of blocks. Each block includes a plurality of pages. The block functions as a minimum unit of a data erasing operation. Each page includes a plurality of memory cells connected to the same word line. The page is a unit of a data write operation and a data read operation. The data for one page as data of a writing unit or data of a reading unit is stored in the DRAM 12.

In a case of writing, data of one page of the writing unit that is read from the DRAM 12 is written to the flash memory 13. Therefore, when the external power supply is unintentionally cut off in the middle of being written, if there is no backup power supply, data in the DRAM 12 in the middle of being written is lost. According to the present embodiment, the PLP capacitor 15 that is a backup power supply is provided. When the external power supply is unintentionally cut off, the controller 11 can write data in the DRAM 12 in the middle of being written to the flash memory 13 by using power from the PLP capacitor 15.

Instead of a page, a word line may define a unit of a data write operation or a data read operation. In this case, the amount of data that is readable or writable using one word line is data of a writing unit or data of a reading unit.

The power supply circuit 14 generates a plurality of power supply voltages required for devices of the SSD 3 including the controller 11, the DRAM 12, the flash memory 13, the PLP capacitor 15, and the like by using a single or a plurality of external power supply voltages supplied from the external power supply (not illustrated). The power supply circuit 14 can generate a plurality of power supply voltages required for at least one device of the SSD 3 by using the energy supplied from the PLP capacitor 15. The power supply circuit 14 may be a single or a plurality of integrated circuits. Such an integrated circuit may be referred to as a Power Management Integrated Circuit (PMIC).

Information indicating various states of the power supply circuit 14 is transmitted to the controller 11. The controller 11 generates a control signal that controls the value of the power supply voltage generated by the power supply circuit 14 according to the command from the host 2 or various kinds of information from the power supply circuit 14. The controller 11 transmits the generated control signal to the power supply circuit 14. Accordingly, the generation of the plurality of power supply voltages to be applied to the devices of the SSD 3 is controlled by the controller 11.

The communication between the power supply circuit 14 and the controller 11 is performed according to a certain communication standard. The communication standard between the power supply circuit 14 and the controller 11 may conform to, for example, the serial communication standard. An example of the serial communication standard is an Inter-Integrated Circuit (I2C) method. In this specification, the communication standard between the power supply circuit 14 and the controller 11 conforms to the I2C method.

The power supply circuit 14 further includes a capacitance measurement circuit 41 that can measure the capacitance of the PLP capacitor 15. The capacitance measurement circuit 41 can measure the capacitance of the PLP capacitor 15, for example, by flowing a certain current from the energy charged in a capacitor 51 and measuring the time it takes for the voltage of the capacitor 51 to drop by 1 V. In the present embodiment, the capacitance measurement circuit 41 is built in the power supply circuit 14. It is noted that the embodiment is not limited thereto.

The PLP capacitor 15 including at least one capacitor 51 is connected to the power supply circuit 14. The PLP capacitor 15 is an example of the power storage device. As an example of the capacitor 51, for example, an electric double layer capacitor, a conductive polymer aluminum electrolytic capacitor, and a conductive polymer tantalum solid electric field capacitor may be used.

When the external power supply is unintentionally cut off, the PLP capacitor 15 supplies the energy for protecting data to the power supply circuit 14. The power supply circuit 14 supplies the power supply voltage to the flash memory 13, the controller 11, and the DRAM 12 for a certain period of time after the power supply is cut off, by using the energy of the PLP capacitor 15. The energy of the PLP capacitor 15 is charged from a charging voltage, which is one of the plurality of power supply voltages generated by the power supply circuit 14.

The data transmitted from the host 2 to the SSD 3 is temporarily stored in the DRAM 12. For example, if the data amount stored in the DRAM 12 is the entire data amount of the writing unit of the flash memory 13, the data is written to the flash memory 13. If the writing to the flash memory 13 is completed, the data stored in the DRAM 12 is erased.

The energy used when the PLP function is performed depends on the data amount stored in the DRAM 12. Therefore, when the entire data amount of the writing unit of the flash memory 13 is stored in the DRAM 12, and the external power supply is unintentionally cut off in a state immediately before the data is written to the flash memory 13, the energy for performing the PLP function becomes the maximum. In the following, a value of energy required when the external power supply is unintentionally cut off in the state immediately before the data is written in to the flash memory 13 is referred to as the maximum energy. When the external power supply is unintentionally cut off in a normal state, various amounts of energy are needed for performing the PLP function depending on the data amount stored in the DRAM 12. The normal state is a state in which the entire data amount of the writing unit of the flash memory 13 is not stored in the DRAM 12. In the following, an average value of energy required when the external power supply is unintentionally cut off in the normal state is referred to as the normal energy.

The capacitance of the PLP capacitor 15 is set to be less than the capacitance in which the maximum energy required for performing the PLP function can be charged. That is, the "first energy," defined herein as the energy that can be charged in the PLP capacitor 15, is set to be smaller than the maximum energy required for performing the PLP function. The normal energy required for performing the PLP function is a fraction of the maximum energy required for performing the PLP function. Therefore, when the maximum energy is not required by the SSD 3 for performing the PLP function, even if the energy that can be charged in the PLP capacitor 15 is less than the maximum energy, the SSD 3 may still be able to perform the PLP function.

The PLP capacitor 15 includes a fuse 52. The capacitor 51 is connected to the power supply circuit 14 via the fuse 52 connected in series. The fuse 52 is implemented by a metal fuse that is thermally cut off when an overcurrent of a certain current or more flows. If the fuse 52 is thermally cut off, the capacitor 51 remains disconnected from the power supply circuit 14 unless the fuse 52 is replaced. The fuse 52 is not limited to the metal fuse. The fuse 52 may be implemented by an electronic fuse that transitions to a non-conductive state when the overcurrent is detected. In addition, the configuration in which the PLP capacitor 15 includes the fuse 52 is described. Alternatively, the PLP capacitor 15 may not include the fuse 52.

The connector 16 is a connection terminal for connecting the external device including the host 2 and the SSD 3 or for connecting the SSD's 3 to each other in the information processing system 1. The host 2 or the other SSD 3 in the information processing system 1 and the connector 16 are connected to each other via the cable according to the present embodiment. The connector 16 includes a power supply voltage supply pin 61, a ground pin 62, signal pins 63, an energy sharing pin 64, a communication pin 65, and the like.

The power supply voltage supply pin 61 is a terminal that can supply a single or a plurality of external power supply voltages from the external power supply to the power supply circuit 14. The ground pin 62 is a terminal that can connect the SSD 3 to the ground. The signal pins 63 are terminals that can transmit or receive various control signals and data signals to and from the host 2. The energy sharing pin 64 is a terminal that is connected to the power supply circuit 14 and connect the PLP capacitors 15 in the plurality of SSD's 3 in the information processing system 1 to each other so that energy can be shared between the plurality of SSD's 3 connected to each other. That is, the power supply circuit 14 may share the energy with the plurality of SSD's 3 connected via the energy sharing pins 64 and supply the shared energy to the flash memory 13, the controller 11, and the DRAM 12 for a certain period of time after the power supply is cut off. The communication pins 65 are terminals by which the plurality of SSD's 3 connected via the energy sharing pins 64 can communicate information according to the communication standard, for example, the I2C method. The information includes the total number of SSD's 3 connected to each other via the energy sharing pins 64.

Figure 3:
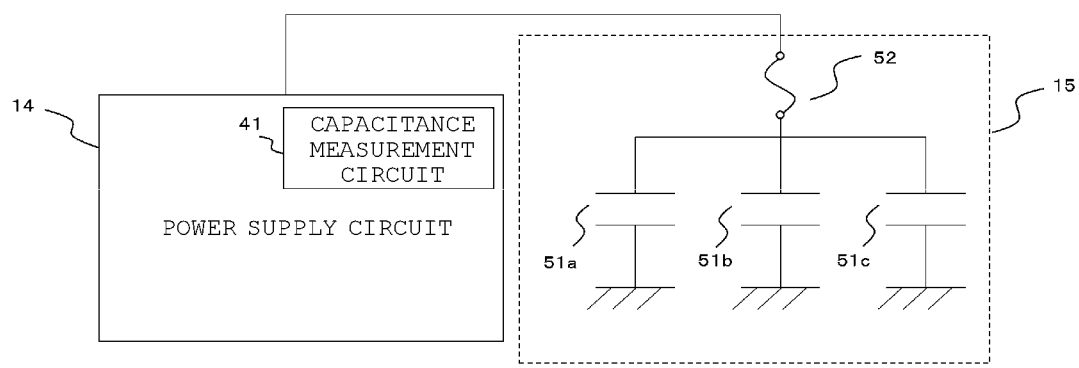
FIG. 3 is a circuit diagram illustrating an example of a configuration of a power storage device in the memory system according to the first embodiment.

FIG. 3 is a circuit diagram illustrating an example of the configuration of the power storage device in the memory system according to the first embodiment. In the above description, the PLP capacitor 15 is configured with a single capacitor 51, and the capacitor 51 is connected to the power supply circuit 14 via the fuse 52 connected in series. However, the embodiment is not limited thereto. As illustrated in FIG. 3, the PLP capacitor 15 may include capacitors 51a, 51b, and 51c connected in parallel. Further, the plurality of capacitors 51a, 51b, and 51c may be connected to the power supply circuit 14 via the fuse 52 connected in series to the plurality of capacitors 51a, 51b, and 51c connected in parallel to each other.

Figure 4:
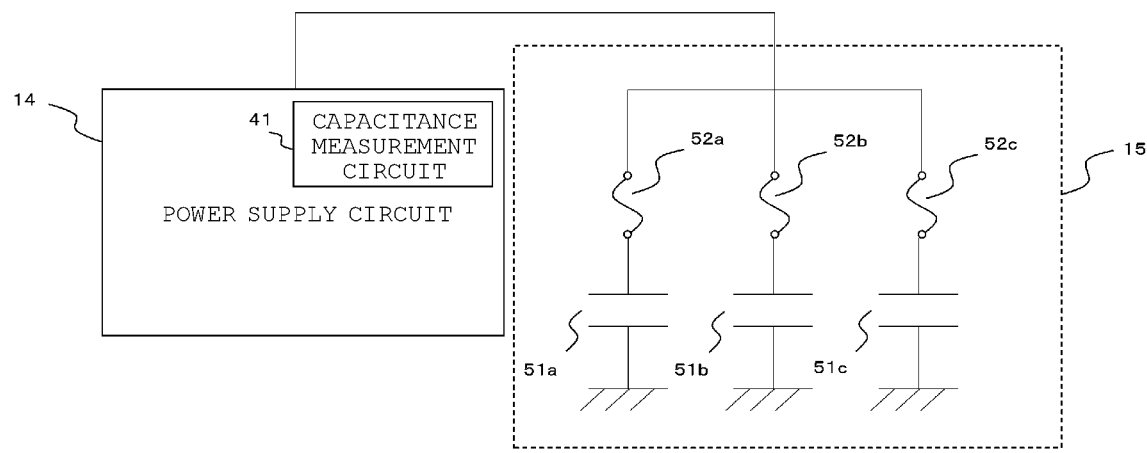
FIG. 4 is a circuit diagram illustrating another example of a configuration of a power storage device in the memory system according to the first embodiment.

FIG. 4 is a circuit diagram illustrating another example of the configuration of the power storage device in the memory system according to the first embodiment. As illustrated in FIG. 4, the plurality of capacitors 51a, 51b, and 51c connected in parallel may be connected to the power supply circuit 14 via a plurality of fuses 52a, 52b, and 52c respectively connected in series to the plurality of capacitors 51a, 51b, and 51c.

The number of capacitors 51 connected in parallel is not limited to three. When the PLP capacitor 15 includes a plurality of capacitors 51, a comparatively small capacitor 51 can be used. Even if the energy required for performing the PLP function cannot be charged in a single capacitor 51, a plurality of capacitors 51 are connected in parallel, and thus the energy required for performing the PLP function can be charged in the PLP capacitor 15.

Figure 5:
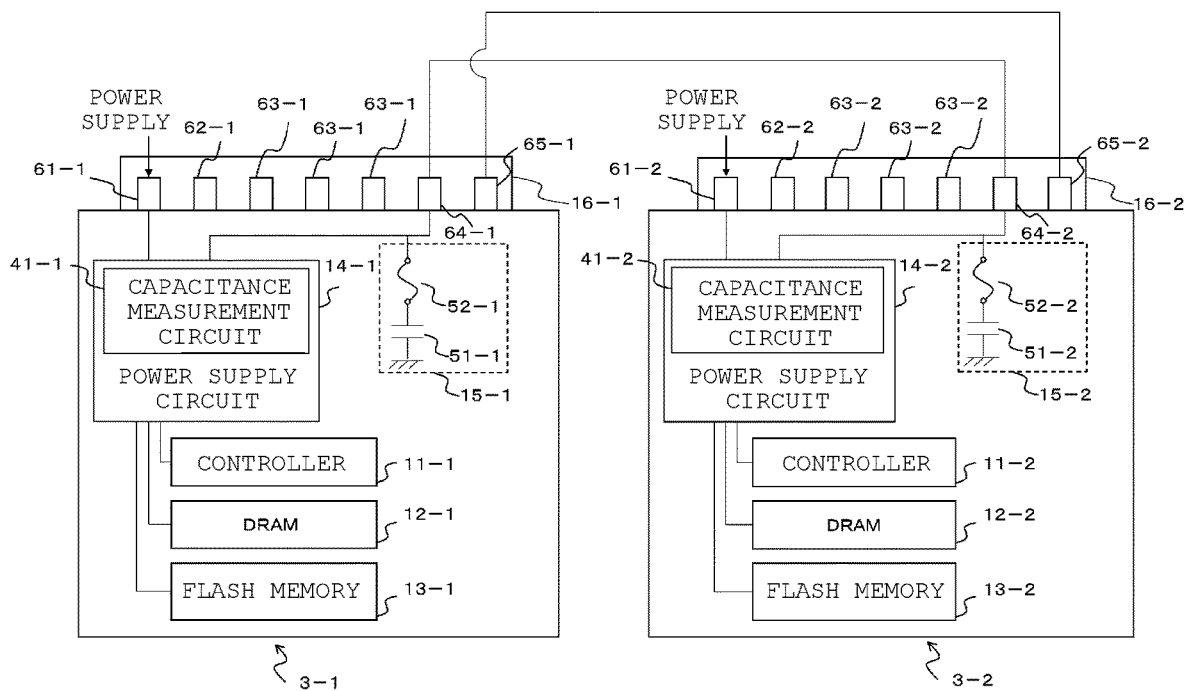
FIG. 5 is a block diagram illustrating an example of a configuration in which the plurality of memory systems according to the first embodiment are connected.

FIG. 5 is a block diagram illustrating an example of the configuration in which the plurality of memory systems according to the first embodiment are connected. With reference to FIG. 5, the configuration in which two memory systems according to the present embodiment are connected to each other via the energy sharing pin is described. Hereinafter, for convenience of explanation, the numerical value of the energy that can be charged in the PLP capacitor 15 is described. It is noted that the particular numerical value is an example. In addition, the numerical values of the maximum energy required for performing the PLP function in one SSD 3 and the normal energy are examples. In addition, the particular numerical value of the total energy that can be charged in the SSD's 3 connected to each other via the energy sharing pins 64 is an example. In addition, the numerical value of the total normal energy required for performing the PLP function in the plurality of SSD's 3 connected to each other via the energy sharing pins 64 is an example.

As illustrated in FIG. 5, the SSD 3-1 and the SSD 3-2 connected to the host 2 (not illustrated) are connected to each other via an energy sharing pin 64-1 and an energy sharing pin 64-2. In addition, the SSD 3-1 and the SSD 3-2 are connected to each other via a communication pin 65-1 and a communication pin 65-2. According to the present embodiment, two SSD's 3 are connected via the energy sharing pins 64 and the communication pins 65. Alternatively, three or more SSD's may be connected to each other.

In the description in the present embodiment, the SSD 3-1 is referred to as an internal memory system, and the SSD 3-2 is referred to as an external memory system. A PLP capacitor 15-1 in the SSD 3-1 is referred to as an internal PLP capacitor, and a PLP capacitor 15-2 in the SSD 3-2 is referred to as an external PLP capacitor.

In the SSD 3 according to the present embodiment, the required energies for performing the PLP function, for example, are 60 mJ at a maximum and 20 mJ normally. For example, the energy of 40 mJ can be charged in each of the internal PLP capacitor 15-1 and the external PLP capacitor 15-2. Therefore, the total energy that can be charged in the internal PLP capacitor 15-1 and the external PLP capacitor 15-2 is 80 mJ.

(Operation Example)

The operation of the memory system according to the first embodiment is described with reference to FIGS. 6 and 7.

Figure 6:
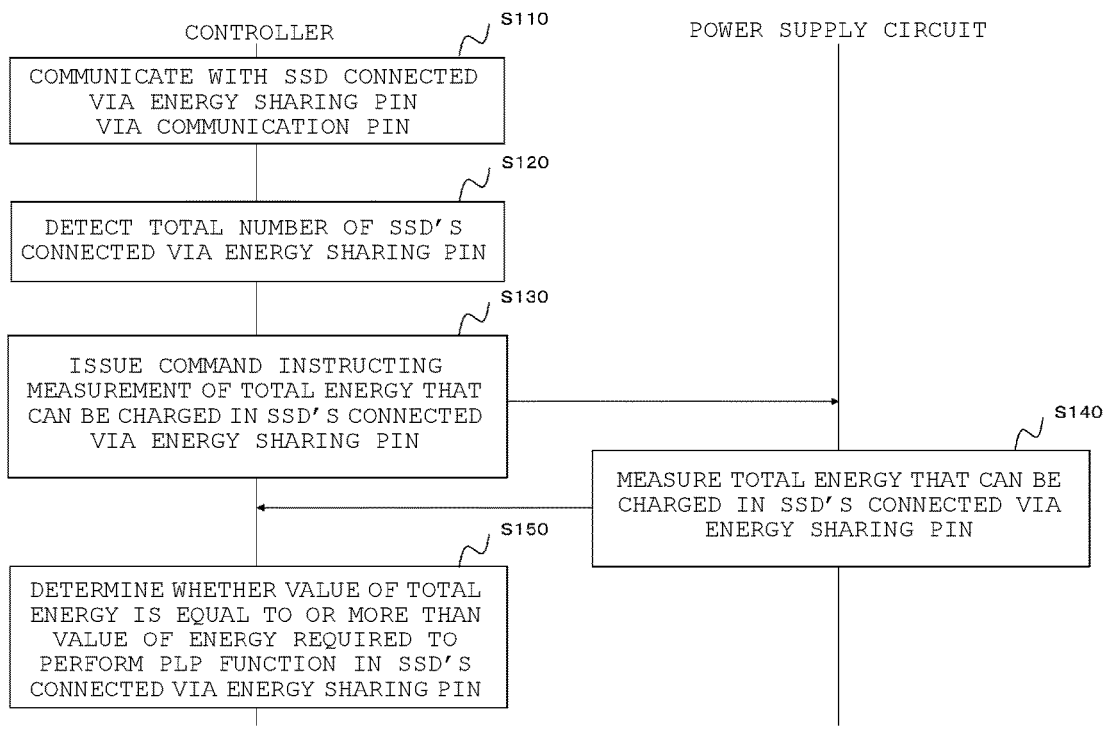
FIG. 6 is a sequence diagram illustrating an example of a process performed by the memory system according to the first embodiment.

FIG. 6 is a sequence diagram illustrating an example of the process performed by the memory system according to the first embodiment. With reference to FIG. 6, a process performed by the SSD 3-1 that makes a pass/fail determination when the power is supplied, is described. Alternatively, the pass/fail determination may be performed at any timing.

When the power is supplied to the SSD 3-1, a controller 11-1 first detects the total number of the plurality of SSD's 3 connected to each other via the energy sharing pins 64.

The controller 11-1 communicates with the SSD's 3 which are connected to each other via the energy sharing pins 64, via the communication pins 65 (S110). According to the present embodiment, the controller 11-1 communicates with a controller 11-2. The controller 11-1 detects the total number of the SSD's 3 which are connected to each other via the energy sharing pins 64, via the communication pins 65 (S120). According to the present embodiment, the total number of the plurality of SSD's 3 connected to each other via the energy sharing pins 64 is two.

If the total number is detected, the controller 11-1 issues a command instructing the measurement of the second energy that is the total energy that can be charged in the SSD's 3 connected to each other via the energy sharing pins 64 to a power supply circuit 14-1 (S130).

If the power supply circuit 14-1 receives the command instructing the measurement of the total energy that can be charged in the plurality of SSD's 3 connected to each other via the energy sharing pins 64, the total energy that can be charged is measured by using a capacitance measurement circuit 41-1 (S140). The power supply circuit 14-1 transmits the value of the measured total energy to the controller 11-1. In the present embodiment, the maximum energy that can be charged in the internal PLP capacitor 15-1 and the external PLP capacitor 15-2 is 80 mJ.

According to the present embodiment, in the SSD 3-1 and the SSD 3-2, a fuse 52-1 and a fuse 52-2 are not thermally cut off, a capacitor 51-1 and a capacitor 51-2 remain connected to the power supply circuit 14-1. Therefore, the energy charged in the internal PLP capacitor 15-1 and the external PLP capacitor 15-2 can be sent to the power supply circuit 14-1.

According to the present embodiment, the value of the total energy that can be charged is measured by using the capacitance measurement circuit 41-1 of the SSD 3-1. However, the value of the total energy that can be charged may be measured by using the capacitance measurement circuit 41 of any one SSD 3 among the plurality of SSD's 3 connected to each other via the energy sharing pins 64. In addition, according to the present embodiment, the value of the total energy that can be charged is measured by using the capacitance measurement circuit 41-1 and transmitted to the controller 11-1. However, the value of the total energy that can be charged may be measured by using the capacitance measurement circuit 41-1 and be sent to the other SSD 3 connected via the energy sharing pins 64, using the communication pins 65.

The controller 11-1 receives the value of the measured total energy that can be charged from the power supply circuit 14-1. Also, the controller 11-1 determines whether the value of the measured total energy that can be charged is equal to or more than the total value of the normal energy required for performing the PLP function in the plurality of SSD's 3 connected to each other via the energy sharing pins 64 (S150). According to the present embodiment, the total value of the normal energy required for performing the PLP function in the plurality of SSD's 3 connected to each other via the energy sharing pins 64 is used as a reference. It is noted that the embodiment is not limited thereto. The total value of the normal energy or the maximum energy required for performing the PLP function in the plurality of SSD's 3 connected to each other via the energy sharing pins 64 may be used as a reference.

When the value of the total energy that can be charged is less than the total value of the normal energy required for performing the PLP function in the plurality of SSD's 3 connected to each other via the energy sharing pin 64, the controller 11-1 determines all of the plurality of SSD's 3 connected to each other via the energy sharing pins 64 as defective. According to the present embodiment, for example, the controller 11-1 determines the SSD 3-1 and the SSD 3-2 to have failed the pass/fail determination. If the value of the total energy that can be charged is equal to or more than the total value of the normal energy required for performing the PLP function in the plurality of SSD's 3 connected to each other via the energy sharing pins 64, the plurality of SSD's 3 connected to each other via the energy sharing pins 64, are used as the main storage of the host 2.

Figure 7:
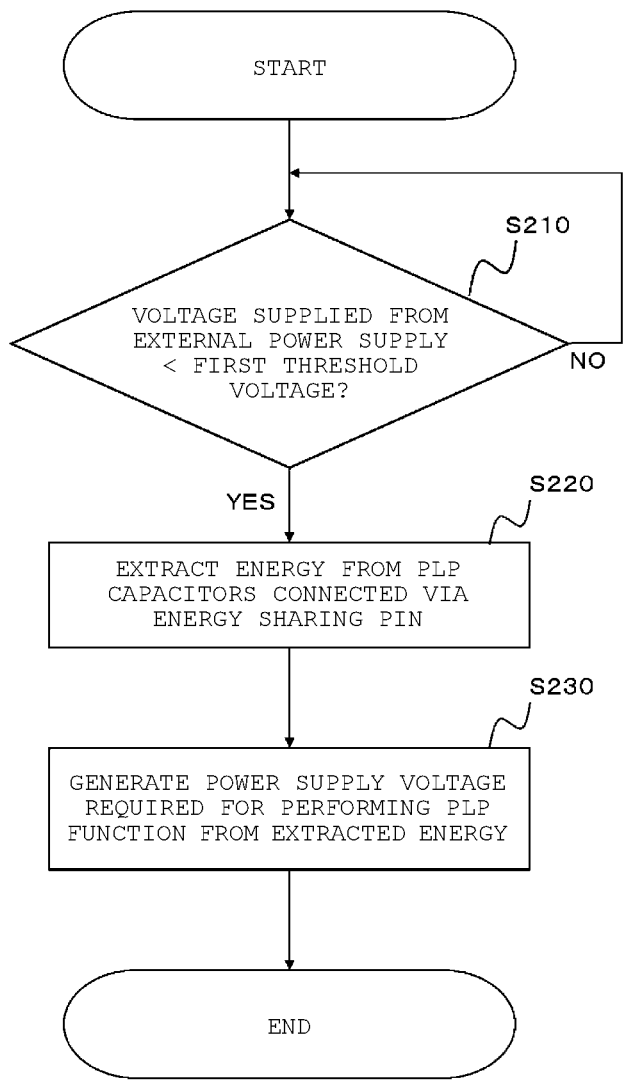
FIG. 7 is a flowchart illustrating an example of a process performed by a power supply circuit in the memory system according to the first embodiment.

FIG. 7 is a flowchart illustrating an example of a process performed by the power supply circuit in the memory system according to the first embodiment. With reference to FIG. 7, an operation of the power supply circuit 14-1 in the SSD 3-1 when the external power supply to the SSD 3-1 and the SSD 3-2 is unintentionally cut off is described. According to the present embodiment, a case where the external power supply to the SSD 3-1 and the SSD 3-2 is unintentionally cut off is described. However, the same is applied when the external power supply to any one of the SSD's 3 is cut off unintentionally. The internal PLP capacitor 15-1 and the external PLP capacitor 15-2 are charged to 40 mJ, respectively.

If an instruction to cut off the power supply is received from the user, the host 2 sends an advance notice of cutting off the power supply to the SSD's 3 before the power supply is actually cut off. In response to this notice, the controller 11 writes the data in the middle of being written that is stored in the DRAM 12 to the flash memory 13. If the writing is completed, the controller 11 sends a writing completion report to the host 2. The host 2 waits for this completion report and cuts off the power supply. Therefore, the data in the middle of being written is not lost.

However, if the power supply to the host 2 is unintentionally cut off due to power failure or the like, the host 2 cannot send the advance notice of cutting off the power supply to the SSD's 3. In this case, the controller 11 does not receive the advance notice, and thus the writing of data in the middle of being written to the flash memory 13 cannot be completed before the supply of the external power supply ends, in some cases.

In order to deal with this unintentional cut-off of the external power supply, the PLP function using the PLP capacitor 15 as the backup power supply is performed.

The power supply circuit 14-1 determines whether the voltage supplied from the external power supply is lower than the first threshold voltage (S210). In order to generate the plurality of power supply voltages required for the devices of the SSD 3, the first threshold voltage is set to be less than the voltage required by the power supply circuit 14-1. If it is determined that the voltage supplied from the external power supply is equal to or more than the first threshold voltage (No in S210), the power supply circuit 14-1 repeats Step S210. If it is determined that the voltage supplied from the external power supply is lower than the first threshold voltage (Yes in S210), the power supply circuit 14-1 determines that the external power supply is unintentionally cut off. If the external power supply is unintentionally cut off, it is assumed that the SSD 3-1 and the SSD 3-2 does not require the maximum energy at the same time. In the present embodiment, for example, the SSD 3-1 is set to require the energy of 60 mJ at a maximum, and the SSD 3-2 is set to require the energy of 20 mJ normally.

The SSD 3-1 requires the energy of 60 mJ, but only the energy of 40 mJ can be charged in the internal PLP capacitor 15-1, and even if 40 mJ is charged, the energy is insufficient. Meanwhile, the SSD 3-2 requires energy of 20 mJ, but the energy of 40 mJ is charged in the external PLP capacitor 15-2. Therefore, the power supply circuit 14-1 extracts the energy from the internal PLP capacitor 15-1 and the external PLP capacitor 15-2 connected to each other via the energy sharing pins 64 (S220). According to the present embodiment, the power supply circuit 14-1 can extract the energy of 80 mJ in total from the internal PLP capacitor 15-1 and the external PLP capacitor 15-2.

The power supply circuit 14-1 generates the power supply voltage required in the devices of the SSD 3-1 from the extracted energy (S230). The power supply circuit 14-1 uses 60 mJ in the SSD 3-1 among the extracted energy of 80 mJ in total. The controller 11-1 writes data in the middle of being written that is stored in a DRAM 12-1 by using the generated power supply voltage to a flash memory 13-1.

(Effect)

As described above, according to the present embodiment, the internal PLP capacitor 15-1 and the external PLP capacitor 15-2 are connected, and the SSD 3-1 and the SSD 3-2 share the energy, so that the energy of the PLP capacitor 15 can be effectively used. That is, the capacitance of the PLP capacitor 15 equipped in each SSD 3 can be reduced.

As illustrated in FIG. 2, the PLP capacitor 15 using the single capacitor 51 can use a comparatively small capacitor 51. In the examples of FIGS. 3 and 4, in the PLP capacitor 15 including the plurality of capacitors 51a, 51b, and 51c, the number of capacitors can be reduced. Specifically, an example in which 60 mJ which is the maximum energy required for performing the PLP function is supplied by using the capacitors 51 each of which can charge the energy of 20 mJ is described. In order to supply the energy with one SSD 3, it is required to provide the PLP capacitor 15 including three capacitors 51 to the SSD 3. However, in order to share and supply the energy with two SSD's 3, the PLP capacitor 15 including two capacitors 51 may be provided in each of the SSD's 3. Therefore, the mounting area of the PLP capacitor 15 can be reduced.

Second Embodiment

Subsequently, a second embodiment is described. The difference of the second embodiment from the first embodiment is that the number of memory systems connected to each other via the energy sharing pins and the communication pins is changed. The configurations other than the number of the memory systems connected to each other via the energy sharing pins and the communication pins are the same as those in the memory system of the first embodiment. Therefore, the same portions are denoted by the same reference numerals, and the descriptions thereof are omitted.

Figure 8:
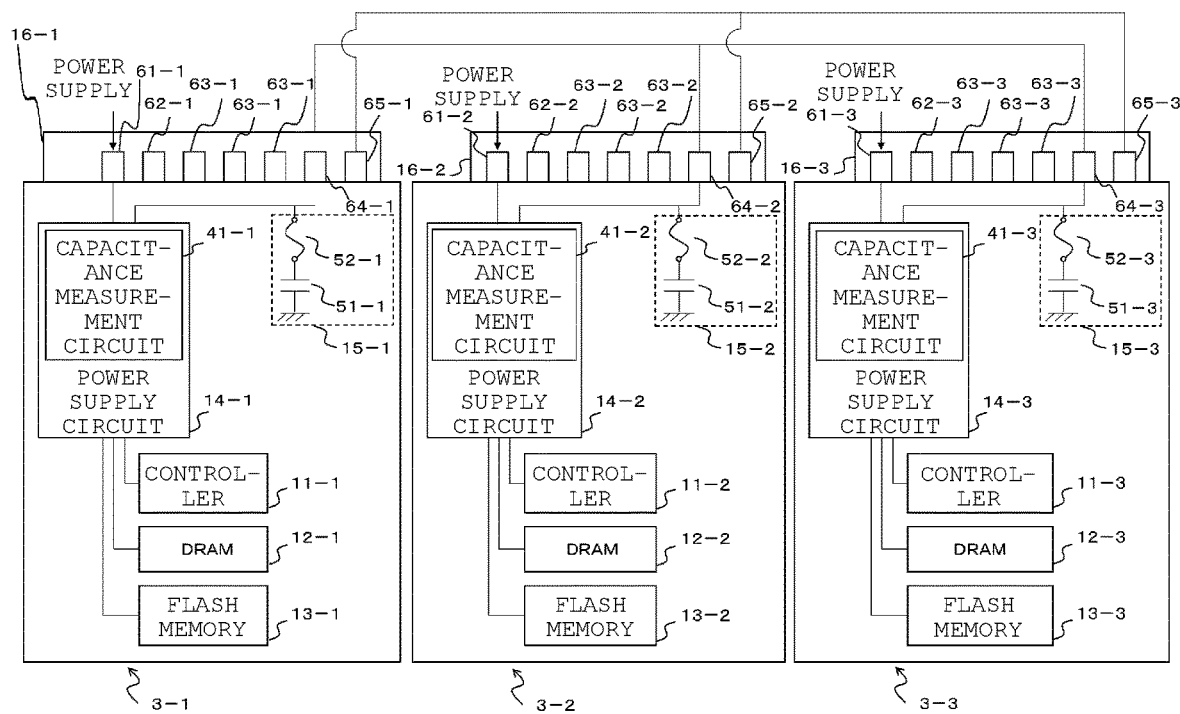
FIG. 8 is a block diagram illustrating an example of a configuration in which a plurality of memory systems according to a second embodiment are connected.

The configuration of the memory system according to the second embodiment is described with reference to FIG. 8. FIG. 8 is a block diagram illustrating an example of the configuration in which the plurality of memory systems according to the second embodiment are connected to each other. The configuration in which three memory systems are connected to each other via the energy sharing pins 64 is described with reference to FIG. 8. In the following, for convenience of explanation, the numerical value of the energy that can be charged in the PLP capacitor 15 is described. However, the particular numerical value is an example. In addition, the maximum energy required for performing the PLP function with one SSD 3 and the numerical value of the normal energy are examples. In addition, the numerical value of the total energy that can be charged in the plurality of SSD's 3 is an example.

As illustrated in FIG. 8, the SSD 3-1, the SSD 3-2, and the SSD 3-3 connected to the host 2 (not illustrated) are connected to each other via the energy sharing pin 64-1, the energy sharing pin 64-2, and an energy sharing pin 64-3. In addition, the SSD3-1, the SSD3-2, and the SSD3-3 are connected to each other via the communication pin 65-1, the communication pin 65-2, and the communication pin 65-3. According to the present embodiment, three SSD's 3 are connected to each other via the energy sharing pins 64 and the communication pins 65. It is noted that the embodiment is not limited thereto.

Here, the SSD 3-1 is referred to as an internal memory system, and the SSD 3-2 and the SSD 3-3 are referred to as external memory systems. In addition, the PLP capacitor 15-1 in the SSD 3-1 is referred to as the internal PLP capacitor, and the PLP capacitor 15-2 in the SSD 3-2 and the PLP capacitor 15-3 in the SSD 3-3 are referred to as the external PLP capacitors.

In order to perform the PLP function, for example, the SSD according to the present embodiment requires the energy of 60 mJ at a maximum and the energy of 20 mJ normally. The energy of 40 mJ can be charged, for example, in each of the internal PLP capacitor 15-1, the external PLP capacitor 15-2, and the external PLP capacitor 15-3. Therefore, the total energy that can be charged in the internal PLP capacitor 15-1, the external PLP capacitor 15-2, and the external PLP capacitor 15-3 is 120 mJ.

(Effect)

As described above, according to the present embodiment, by increasing the number of the SSD's 3 that share the PLP capacitors 15 to three, it is possible to supply the required energy even if greater energy than the memory system according to the first embodiment is required. In addition, even when two SSD's 3 require the maximum energy at the same time, if the energy required by two SSD's 3 for performing the PLP function does not exceed the total energy charged in the three connected PLP capacitors 15, it is possible to supply the energy required for performing the PLP function.

Third Embodiment

Subsequently, a third embodiment is described. The difference of the third embodiment from the second embodiment is that a method of sharing the energy between the external memory systems connected to each other via the energy sharing pins and the communication pins is changed.

The configurations other than the method of sharing the energy between the external memory systems connected to each other via the energy sharing pins and the communication pins are the same as those in the memory system according to the second embodiment. Therefore, the same portions are denoted by the same reference numerals, and the description thereof is omitted.

(Operation Example)

The operation of the memory system according to the third embodiment is described with reference to FIG. 9. In the following, for convenience of explanation, the numerical value of the energy that can be charged in the PLP capacitor 15 is described. However, the particular numerical value is an example. In addition, the maximum energy required by one SSD 3 for performing the PLP function and the numerical value of the normal energy are examples. In addition, the numerical value of the energy required for performing the PLP function in the plurality of SSD's 3 connected to each other via the energy sharing pins 64 and the energy required for performing the PLP function in one SSD 3 are examples. Further, the energy charged in the internal PLP capacitor 15-1 is also an example.

Figure 9:
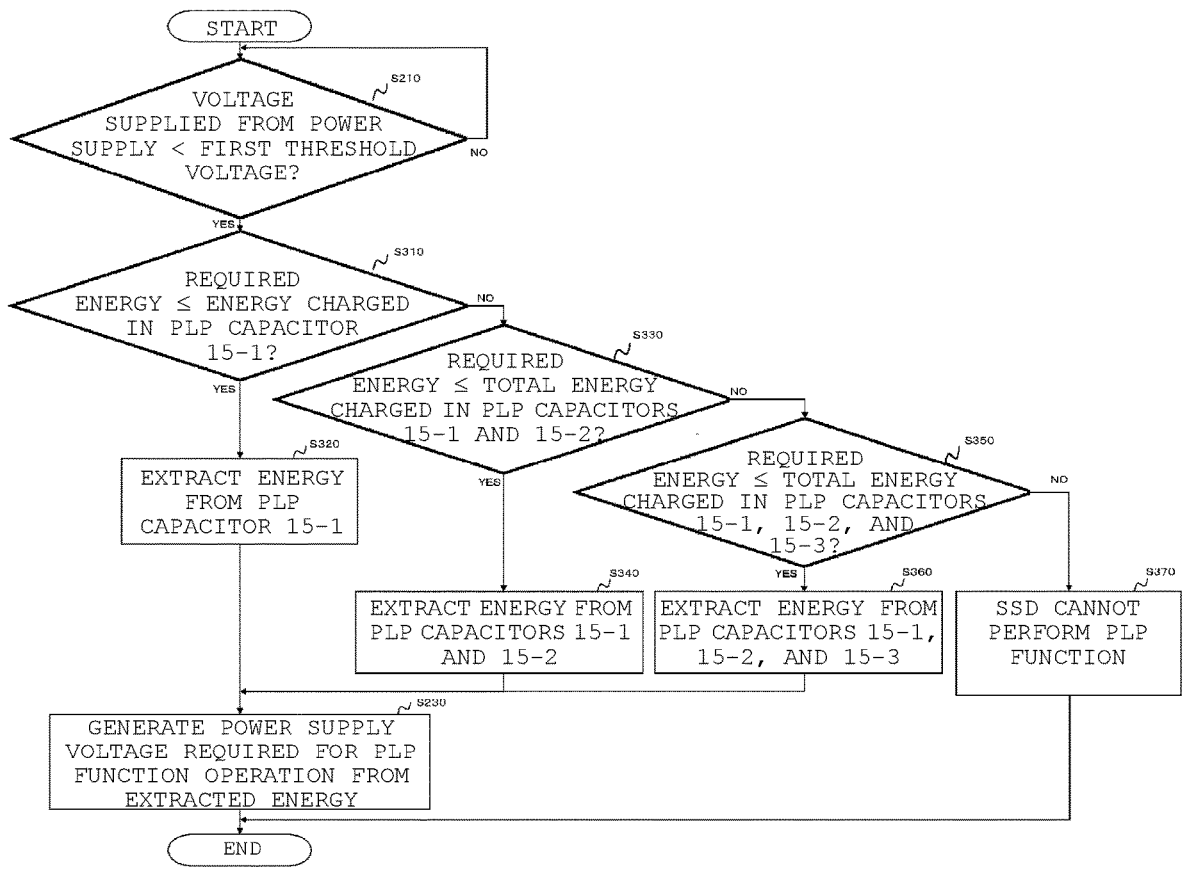
FIG. 9 is a flowchart illustrating an example of a process performed by the power supply circuit in a memory system according to a third embodiment.

FIG. 9 is a flowchart illustrating an example of the process performed by the power supply circuit in the memory system according to the third embodiment. With reference to FIG. 9, an operation of the power supply circuit 14-1 in the SSD 3-1 when the external power supply to the SSD 3-1 and the SSD 3-2 among three SSD's 3 connected to each other via the energy sharing pins 64 are unintentionally cut off is described. According to the present embodiment, the memory systems to which the external power supply is unintentionally cut off are not limited to the SSD 3-1 and the SSD 3-2. The same operation is performed when the external power supply to all of the SSD 3-1, the SSD 3-2, and the SSD 3-3 are unintentionally cut off, or when the external power supply to any one of the SSD's 3 is unintentionally cut off.

In order to perform the PLP function, for example, the SSD 3 according to the present embodiment requires the energy of 60 mJ at a maximum and the energy of 20 mJ normally. The energy of 40 mJ can be charged in each of the internal PLP capacitor 15-1, the external PLP capacitor 15-2, and the external PLP capacitor 15-3. The total energy that can be charged in the internal PLP capacitor 15-1, the external PLP capacitor 15-2, and the external PLP capacitor 15-3 is 120 mJ.

The power supply circuit 14-1 determines whether the voltage supplied from the external power supply is less than the first threshold voltage (S210). If it is determined that the voltage supplied from the external power supply is equal to or more than the first threshold voltage (No in S210), the power supply circuit 14-1 repeats Step S210. If it is determined that the voltage supplied from the external power supply is less than the first threshold voltage (Yes in S210), the power supply circuit 14-1 determines that the external power supply is unintentionally cut off.

Subsequently, the power supply circuit 14-1 determines whether the energy required for performing the PLP function in the SSD 3-1 is less than the energy charged in the internal PLP capacitor 15-1 (S310).

If the energy required for performing the PLP function of the SSD 3-1 is less than or equal to the energy charged in the internal PLP capacitor 15-1 (Yes in S310), the power supply circuit 14-1 extracts the energy from the internal PLP capacitor 15-1 (S320). If the required energy is greater than the energy charged in the internal PLP capacitor 15-1 (No in S310), the controller 11-1 communicates with the controller 11-2 and shares the value of the energy required by each of the SSD's 3 for performing the PLP function in the SSD 3-1 and the SSD 3-2. The power supply circuit 14-1 determines whether the energy required by the SSD 3-1 and the SSD 3-2 for performing the PLP function is less than the total energy charged in the internal PLP capacitor 15-1 and the external PLP capacitor 15-2 (S330).

If the required energy is less than or equal to the total energy charged in the internal PLP capacitor 15-1 and the external PLP capacitor 15-2 (Yes in S330), the power supply circuit 14-1 extracts the energy from the internal PLP capacitor 15-1 and the external PLP capacitor 15-2 (S340). If the required energy is greater than the total energy charged in the internal PLP capacitor 15-1 and the external PLP capacitor 15-2 (No in S330), the power supply circuit 14-1 determines whether the energy required by the SSD 3-1 and the SSD 3-2 for performing the PLP function is less than the total energy charged in the internal PLP capacitor 15-1, the external PLP capacitor 15-2, and the external PLP capacitor 15-3 (S350).

If the required energy is less than or equal to the total energy charged in the internal PLP capacitor 15-1, the external PLP capacitor 15-2, and the external PLP capacitor 15-3 (Yes in S350), the power supply circuit 14-1 extracts the energy from the internal PLP capacitor 15-1, the external PLP capacitor 15-2, and the external PLP capacitor 15-3 (S360). If the required energy is greater than the total energy charged in the internal PLP capacitor 15-1, the external PLP capacitor 15-2, and the external PLP capacitor 15-3 (No in S350), a notification that the SSD 3 that cannot perform the PLP function is generated (S370). The power supply circuit 14-1 may notify the controller 11-1 that the SSD 3 that cannot perform the PLP function. In addition, the controller 11-1 may notify the host 2 that the SSD 3 that cannot perform the PLP function.

In the present embodiment, the SSD 3-1 is set to require the energy of 60 mJ at a maximum, and the SSD 3-2 is set to require the energy of 20 mJ normally. When the energy of 80 mJ required by all the SSD's 3 (the SSD 3-1, the SSD 3-2) for performing the PLP function is less than or equal to the total energy of 80 mJ that is charged in the internal PLP capacitor 15-1 and the external PLP capacitor 15-2 (Yes in S330), the power supply circuit 14-1 extracts the energy from the internal PLP capacitor 15-1 and the external PLP capacitor 15-2 (S340).

The power supply circuit 14-1 generates the power supply voltage required by the devices of the SSD 3-1 from the extracted energy (S230). The power supply circuit 14-1 uses 60 mJ in the SSD 3-1 out of the extracted total energy of 80 mJ. The controller 11-1 writes the data that was in the middle of being written, which is stored in the DRAM 12-1 to the flash memory 13-1 by using the generated power supply voltage.

(Effect)

As described above, according to the present embodiment, in the plurality of SSD's 3 connected to each other via the energy sharing pins 64, the energy required for performing the PLP function is extracted from the PLP capacitors 15 of some of the SSD's 3 among the plurality of SSD's 3. Accordingly, compared with the first embodiment, the energy of the PLP capacitor 15 can be more effectively used. Therefore, the PLP capacitor 15 from which the energy is not extracted is not required to be charged again.

Fourth Embodiment

Subsequently, a fourth embodiment is described. The difference of the fourth embodiment from the first embodiment is that the configuration of the connector of the memory system and the configuration near the connector and the process performed by the SSD 3-1 that determines pass/fail when the power is supplied is changed. The configurations other than these changes are the same as those in the memory system according to the first embodiment. Therefore, the same portions are denoted by the same reference numerals, and the descriptions thereof are omitted.

(Configuration)

Figure 10:
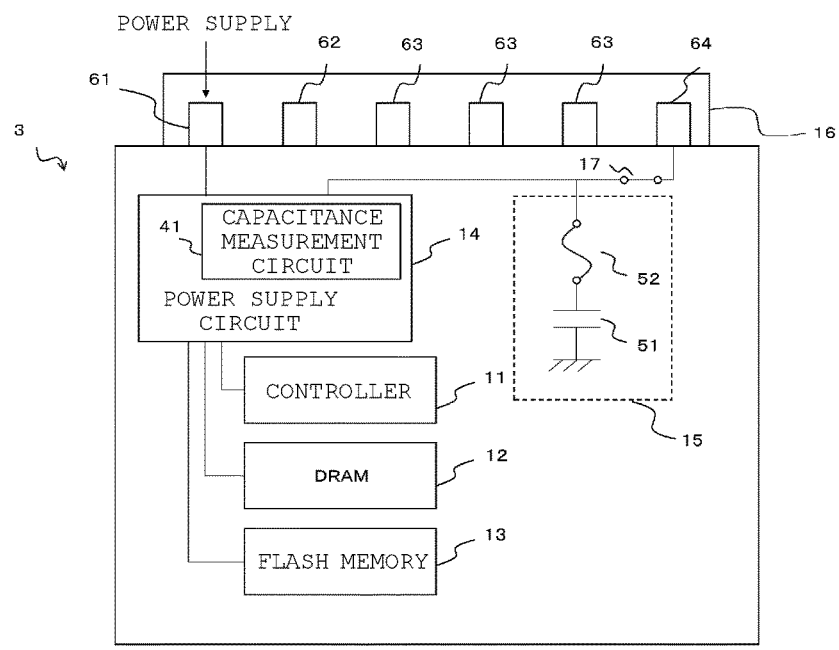
FIG. 10 is a block diagram illustrating an example of a configuration of a memory system according to a fourth embodiment.

FIG. 10 is a block diagram illustrating an example of a configuration of the memory system according to the fourth embodiment. As illustrated in FIG. 10, the SSD 3 includes the controller 11, the DRAM 12, the flash memory 13, the power supply circuit 14, the PLP capacitor 15, the connector 16, a switch 17, and the like.

The controller 11 functions as the memory controller configured to control the flash memory 13. The controller 11 may be implemented by a circuit such as a System on a Chip (SoC). The controller 11 writes data to the flash memory 13 or read data from the flash memory 13 according to the command from the host 2. In addition, the controller 11 turns on and off the switch 17.

The connector 16 is a connection terminal that connects the external device including the host 2 and the SSD 3 or connects the SSD's 3 in the information processing system 1 to each other. According to the present embodiment, the host 2 or the other SSD 3 in the information processing system 1, and the connector 16 are connected to each other via a cable. The connector 16 includes the power supply voltage supply pin 61, the ground pin 62, the signal pin 63, the energy sharing pin 64, and the like.

The power supply voltage supply pin 61 is a terminal that can supply a single or a plurality of external power supply voltages supplied from the external power supply to the power supply circuit 14. The ground pin 62 is a terminal that can connect the SSD 3 to the ground. The signal pin 63 is a terminal that can send and receive various control signals and data signals to and from the host 2. The energy sharing pin 64 is a terminal that connects the PLP capacitors 15 that are connected to the power supply circuit 14 and provided in the plurality of SSD's 3 in the information processing system 1 and are capable of sharing the energy between the plurality of SSD's 3 connected to each other. In the present embodiment, the information of the SSD's 3 is sent to the host 2 via the signal pin 63. The information of the SSD 3 sent to the host 2 can be sent to the other SSD's 3 in the information processing system 1. The information includes, for example, the value of the energy that can be charged in the PLP capacitor 15 and the value of the total energy that can be charged in the internal PLP capacitor 15-1 and the external PLP capacitor 15-2.

The switch 17 is connected to the power supply circuit 14 and connects (when turned on) or separates (when turned off) the power supply circuit 14 and the energy sharing pin 64. The switch 17 is turned off during the pass/fail determination but is otherwise basically turned on.

Figure 11:
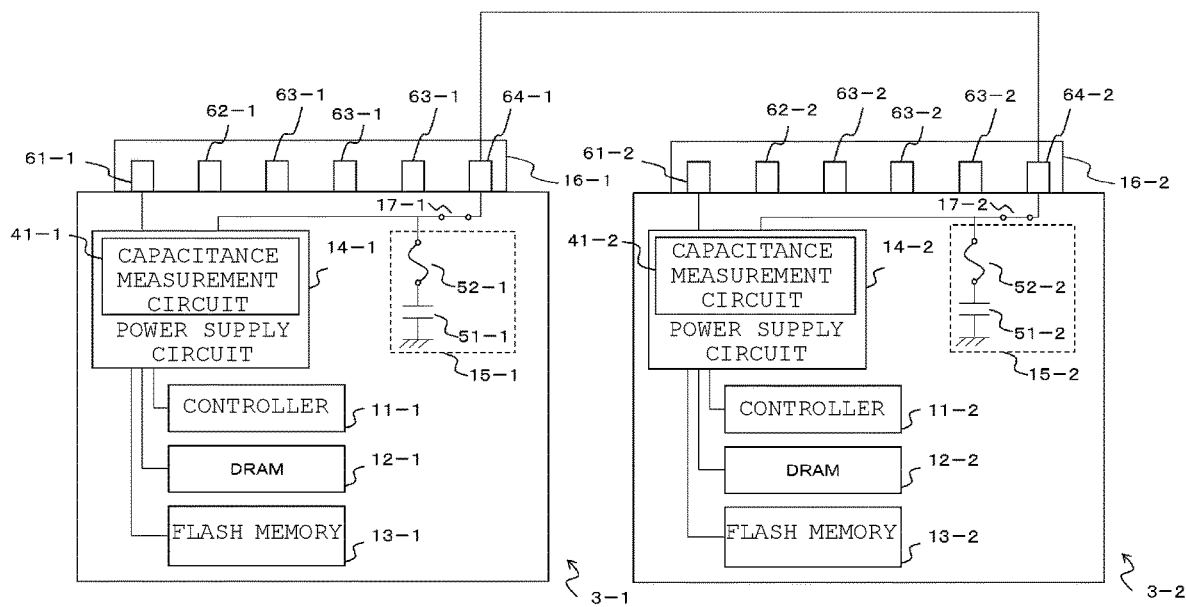
FIG. 11 is a block diagram illustrating an example of a configuration in which the plurality of memory systems according to the fourth embodiment are connected.

FIG. 11 is a block diagram illustrating an example of the configuration in which the plurality of memory systems according to the fourth embodiment are connected to each other. With reference to FIG. 11, a configuration in which two memory systems according to the present embodiment are connected to each other via the energy sharing pins is described.

As illustrated in FIG. 11, the SSD 3-1 and the SSD 3-2 connected to the host 2 (not illustrated) are connected to each other via the energy sharing pin 64-1 and the energy sharing pin 64-2. According to the present embodiment, two SSD's 3 connected to each other via the energy sharing pins 64 are used, but three or more SSD's may be used.

In the description of the present embodiment, the SSD 3-1 is referred to as the internal memory system, and the SSD 3-2 is referred to as an external memory system. In addition, the PLP capacitor 15-1 in the SSD 3-1 is referred to as an internal PLP capacitor, and the PLP capacitor 15-2 in the SSD 3-2 is referred to as an external PLP capacitor.

(Operation Example)

Figure 12:
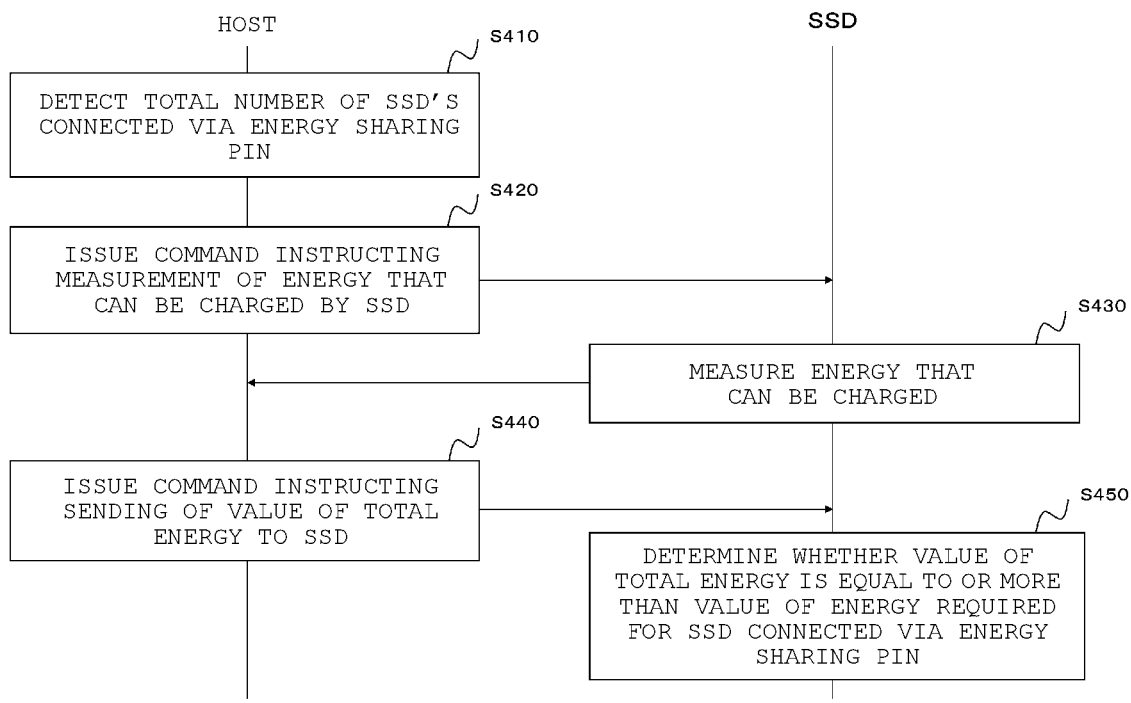
FIG. 12 is a sequence diagram illustrating an example of a process performed by an information processing system that includes the memory system according to the fourth embodiment.

FIG. 12 is a sequence diagram illustrating an example of a process performed by the information processing system that includes the memory system according to the fourth embodiment. With reference to FIG. 12, the process performed by the host 2 and the SSD 3-1 that to make the pass/fail determination when the power is supplied is described. In addition, the pass/fail determination may not be performed when the power is supplied but may be performed at any timing.

When the power is supplied to the SSD 3-1, the host 2 detects the number of the SSD's 3 connected to each other via the energy sharing pins 64 (S410). According to the present embodiment, there are two SSD's 3 connected to each other via the energy sharing pins 64.

Subsequently, the host 2 issues a command instructing the SSD 3-1 to measure the energy that can be charged in the SSD 3 (S420). According to the present embodiment, the host 2 issues a command instructing the SSD 3-2 connected via the energy sharing pins 64 to measure the energy that can be charged in the SSD 3 in the same manner.

When the command instructing to measure the energy that can be charged in the SSD 3 is received, the SSD 3-1 measures the first energy that is the energy that can be charged in the internal PLP capacitor 15-1 (S430). The SSD 3-1 transmits the value of the energy that can be charged in the internal PLP capacitor 15-1 to the host 2.

The host 2 receives the value of the energy that can be charged in the internal PLP capacitor 15-1 from the SSD 3-1. In addition, the host 2 also receives the value of the energy that can be charged in an external PLP capacitor 15-2 from the SSD 3-2 in the same manner. Subsequently, the host 2 adds up the received values of the energy that can be charged in the internal PLP capacitor 15-1 and the external PLP capacitor 15-2. Also, the host 2 issues a command to send the value of the total energy that can be charged, to the SSD 3-1, and also sends the value of the total energy that can be charged, to the SSD 3-1 (S440).

The SSD 3-1 receives the command to send the value of the total energy that can be charged and receives the value of the total energy that can be charged. The controller 11-1 of the SSD 3-1 determines whether the value of the total energy that can be charged is equal to or more than the total value of the normal energy required for performing the PLP function by the plurality of SSD's 3 connected to each other via the energy sharing pins 64 and notifies the host 2 of the determination result (S450). According to the present embodiment, the total value of the normal energy required for performing the PLP function in the plurality of SSD's 3 connected to each other via the energy sharing pins 64 is used as a reference. It is noted that the embodiment is not limited thereto. The total value of the normal energy or the maximum energy required for performing the PLP function in the plurality of SSD's 3 connected to each other via the energy sharing pins 64 may be used as a reference.

If the value of the total energy that can be charged is more than the total value of the normal energy required for performing the PLP function by the plurality of SSD's 3 connected to each other via the energy sharing pins 64, the plurality of SSD's 3 connected to each other via the energy sharing pins 64 are used as the main storage of the host 2. If the value of the total energy that can be charged is less than the total value of the normal energy required for performing the PLP function by the plurality of SSD's 3 connected to each other via the energy sharing pins 64, the controller 11-1 determines all the plurality of SSD's 3 connected to each other via the energy sharing pins 64 to be defective. According to the present embodiment, for example, the controller 11-1 determines the SSD 3-1 and the SSD 3-2 to have failed the pass/fail determination. The controller 11-1 may transmit the pass/fail determination result to the host 2.

According to the present embodiment, the pass/fail determination is performed by using the controller 11-1 of the SSD 3-1. The pass/fail determination may be performed by using the controller 11 of any one SSD 3 among the plurality of SSD's 3 connected to each other via the energy sharing pins 64. Otherwise, after the host 2 adds up the values of the energy that can be charged that are received from the SSD's 3, the host 2 may determine whether the added value is equal to or more than the total value of the normal energy required for performing the PLP function by the plurality of SSD's 3 connected to each other via the energy sharing pins 64.

Figure 13:
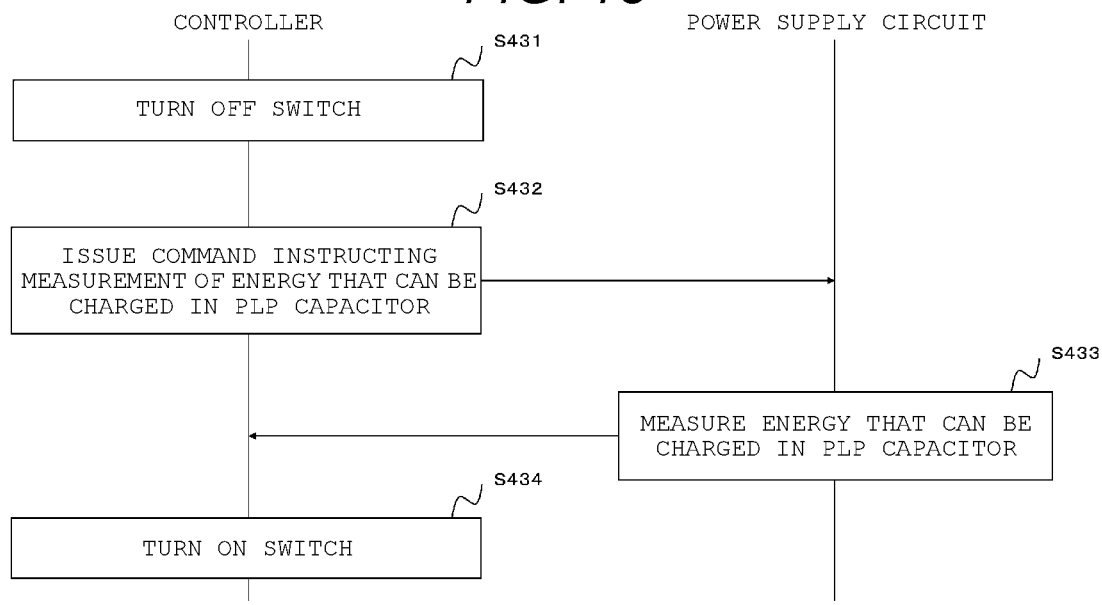
FIG. 13 is a sequence diagram illustrating an example of a process performed by the memory system according to the fourth embodiment.

FIG. 13 is a sequence diagram illustrating an example of a process performed by the memory system according to the fourth embodiment. With reference to FIG. 13, a process performed by the SSD 3-1 in Step S430 in the pass/fail determination of FIG. 12 is described.

If the controller 11-1 receives the command instructing the measurement of the energy that can be charged in the SSD 3-1, the switch 17 is turned off and separates the energy sharing pin 64-1 and the internal PLP capacitor 15-1 (S431). By separating the energy sharing pin 64-1 and the internal PLP capacitor 15-1, the power supply circuit 14-1 can measure the energy that can be charged in the internal PLP capacitor 15-1.

The controller 11-1 issues a command instructing the measurement of the energy that can be charged in the internal PLP capacitor 15-1 to the power supply circuit 14-1 (S432).

When the command instructing the measurement of the energy that can be charged in the internal PLP capacitor 15-1 from the controller 11-1 is received, the power supply circuit 14-1 measures the energy that can be charged by using the capacitance measurement circuit 41-1 (S433). The power supply circuit 14-1 transmits the value of the measured energy that can be charged in the internal PLP capacitor 15-1 to the controller 11-1.

When the value of the measured energy that can be charged in the internal PLP capacitor 15-1 is received from the power supply circuit 14-1, the controller 11-1 turns on the switch 17 and connects the energy sharing pin 64-1 and the internal PLP capacitor 15-1, again (S434). In addition, the controller 11-1 transmits the value of the measured energy that can be charged in the internal PLP capacitor 15-1 to the host 2.

(Effect)

As described above, according to the present embodiment, by removing the communication pin 65 and providing the switch 17, the mounting area of the PLP capacitor 15 is reduced.

According to at least one memory system of the embodiments described above, the PLP capacitors are connected to the plurality of SSDs, and the energy is shared, so that the mounting area of the PLP capacitor can be reduced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
   a nonvolatile memory;
   a controller configured to control the nonvolatile memory;
   a power supply circuit that is connected to the controller, and configured to generate a power supply voltage for the nonvolatile memory and the controller from a voltage supplied from at least one external power supply;
   a power storage device that is connected to the power supply circuit and is configured to charge to a first energy from a charging voltage supplied by the power supply circuit; and
   an energy sharing pin that is connected to the power supply circuit and the power storage device, and is connectable to an external power storage device in an external memory system.

2. The memory system according to claim 1, wherein when the energy sharing pin is connected to the external power storage device in the external memory system and the voltage supplied from the external power supply is less than a first threshold voltage, the power supply circuit supplies the power supply voltage to the controller and the nonvolatile memory by using energy supplied from the power storage device and from the external power storage device.

3. The memory system according to claim 1,
   wherein the power supply voltage includes a first voltage and a second voltage,
   the charging voltage is the first voltage, and
   the power supply circuit supplies the second voltage to the controller and the nonvolatile memory by using energy supplied from the power storage device and from the external power storage device when the energy sharing pin is connected to the external power storage device in the external memory system and the voltage supplied from the external power supply is less than a first threshold voltage.

4. The memory system according to claim 1, wherein the power storage device includes:
   at least one capacitor, and
   a fuse between the capacitor and the power supply circuit.

5. The memory system according to claim 4,
   wherein the fuse is a metal fuse that is thermally cut off when an overcurrent flows, or an electronic fuse that transitions to a non-conductive state when an overcurrent is detected.

6. The memory system according to claim 1, further comprising:
   a capacitance measurement circuit configured to measure a value of total energy that can be charged in the power storage device and the external power storage device when the energy sharing pin is connected to the external power storage device in the external memory system.

7. The memory system according to claim 6, wherein the controller determines that the total energy is sufficient for the memory system and the external memory system when the total energy is greater than or equal to a sum of an energy required for completing writing to the nonvolatile memory by the memory system and an energy required for completing the writing to a nonvolatile memory in the external memory system by the external memory system.

8. The memory system according to claim 6,
wherein the controller determines that the total energy is sufficient for the memory system and the external memory system when the total energy is greater than or equal to a sum of a normal energy required for completing writing to the nonvolatile memory by the memory system and a normal energy required for completing the writing to a nonvolatile memory in the external memory system by the external memory system.

9. The memory system according to claim 6,
wherein the controller determines that the total energy is sufficient for the memory system and the external memory system when the total energy is greater than or equal to a sum of a maximum energy required for completing writing to the nonvolatile memory by the memory system and a normal energy required for completing the writing to a nonvolatile memory in the external memory system by the external memory system.

10. The memory system according to claim 7,
wherein the controller determines whether or not the total energy is sufficient for the memory system and the external memory system when the energy sharing pin is connected to the external power storage device and power is supplied to the memory system.

11. The memory system according to claim 1,
wherein, when the energy sharing pin is connected to the external power storage device in the external memory system and a voltage supplied from the external power supply is less than a first threshold voltage, the power supply circuit
extracts energy from the power storage device when a value of energy required for completing writing to the nonvolatile memory by the memory system is equal to or less than the value of the first energy and supplies the power supply voltage to the controller and the nonvolatile memory by using the energy extracted from the power storage device, and
extracts energy from the power storage device and the external power storage device when the value of the energy required is more than the value of the first energy, and supplies the power supply voltage to the controller and the nonvolatile memory by using the energy extracted from the power storage device and the external power storage device.

12. The memory system according to claim 1, further comprising:
a volatile memory,
wherein the controller is configured to write data stored in the volatile memory to the nonvolatile memory using energy from the power storage device when the voltage supplied from the external power supply is less than a first threshold voltage.

13. The memory system according to claim 1, further comprising:
a switch that is connected to the power supply circuit and is capable of controlling connection between the power supply circuit and the energy sharing pin; and
a capacitance measurement circuit configured to measure the value of the first energy when the connection between the power supply circuit and the energy sharing pin is separated by the switch,
wherein, in response to the controller receiving a command instructing measurement of the first energy from a host device,
the capacitance measurement circuit measures the first energy, and
the controller obtains information including a value of total energy that can be charged in the power storage device and the external power storage device from the host device, and determines whether or not the total energy is sufficient by comparing the value of the total energy with a sum of an energy required for completing writing to the nonvolatile memory by the memory system and an energy required for completing writing to a nonvolatile memory in the external memory system by the external memory system.

14. A storage system comprising:
a first memory system; and
a second memory system connected to the first memory system, wherein
the first memory system comprises a nonvolatile memory, a controller configured to control the nonvolatile memory, a power supply circuit that is connected to the controller, and configured to generate a power supply voltage for the nonvolatile memory and the controller from a voltage supplied from at least one external power supply, a first power storage device that is connected to the power supply circuit and is configured to charge to a first energy from a charging voltage supplied by the power supply circuit, and a first energy sharing pin that is connected to the power supply circuit, to the first power storage device, and to a second power storage device in the second memory system through a second energy sharing pin in the second memory system, and
the power supply circuit supplies the power supply voltage to the controller and the nonvolatile memory by using energy supplied from the first power storage device and from the second power storage device through the first and second energy sharing pins when the voltage supplied from the external power supply is less than a first threshold voltage.

15. The storage system according to claim 14, further comprising:
a third memory system that includes a third power storage device, and a third energy sharing pin connected to the first and second energy sharing pins, wherein
the power supply circuit supplies the power supply voltage to the controller and the nonvolatile memory by using energy supplied from the first power storage device and from the second and third power storage devices when the voltage supplied from the external power supply is less than the first threshold voltage.

16. A memory system comprising:
a volatile memory;
a nonvolatile memory;
a controller;
a power supply circuit configured to generate a power supply voltage for the volatile memory, the nonvolatile memory, and the controller from a voltage supplied from at least one external power supply;
a power storage device including at least one capacitor that is charged from a charging voltage supplied by the power supply circuit; and an energy sharing pin that is connected to the power supply circuit and the power storage device, wherein the controller is configured to write data stored in the volatile memory to the nonvolatile memory using the energy from the power supply circuit when the voltage supplied from the external power supply is greater than or equal to a threshold voltage, and using the energy from the charged capacitor and an external power storage device connected to the energy sharing pin when the voltage supplied from the external power supply is less than the threshold voltage.

17. The memory system according to claim 16, wherein the at least one capacitor, when fully charged, stores energy equal to a first energy amount that is greater than a normal amount of energy required to write data stored in the volatile memory to the nonvolatile memory and is less than a maximum amount of energy required to write data stored in the volatile memory to the nonvolatile memory.

18. The memory system according to claim 17, wherein the at least one capacitor includes three capacitors that are connected in parallel.

19. The memory system according to claim 17, further comprising:

a capacitance measurement circuit configured to measure a capacitance of the at least one capacitor, wherein upon power-on of the memory system, the capacitance measurement circuit measures the capacitance of the at least one capacitor, and the controller determines if a total energy that can be charged by the at least one capacitor and by one or more power storage devices connected to the memory system through the energy sharing pin is sufficient to support writing of data stored in the volatile memory to the nonvolatile memory.

20. The memory system according to claim 19, further comprising:

a communication pin by which the controller receives information about the total number of memory systems, which include the memory system and one or more external memory systems connected to the memory system.

\* \* \* \* \*